United States Patent [19]

Cammarano et al.

[11] Patent Number: 5,192,622

[45] Date of Patent: Mar. 9, 1993

[54] LOW-COST TERNARY COMPOSITE FOR USE IN VIAS IN GLASS-CERAMIC STRUCTURES

[75] Inventors: Armando S. Cammarano, Hyde Park; Giulio DiGiacomo, Hopewell Junction; Nunzio DiPaolo, Poughkeepsie, all of N.Y.

[73] Assignee: International Business Machines Corporation, Armonk, N.Y.

[21] Appl. No.: 743,439

[22] Filed: Aug. 9, 1991

[51] Int. Cl.⁵ .......................... B22F 3/00; B22F 5/00; B22F 7/00
[52] U.S. Cl. .................................. 428/551; 428/552; 428/560; 428/564; 428/565; 75/230; 75/247
[58] Field of Search ............ 428/551, 552, 560, 564, 428/565, 568, 539.5; 75/230, 247

[56] References Cited

U.S. PATENT DOCUMENTS

| | | | |
|---|---|---|---|
| 3,374,110 | 3/1968 | Miller | 117/212 |
| 3,537,892 | 11/1970 | Milkovich et al. | 117/227 |
| 3,934,336 | 1/1976 | Morse | 29/627 |
| 4,191,789 | 3/1980 | Brown et al. | 427/97 |
| 4,323,593 | 4/1982 | Tsunashima | 427/97 |
| 4,353,957 | 10/1982 | Rutt et al. | 428/292 |
| 4,426,356 | 1/1984 | Nair | 419/21 |
| 4,490,429 | 12/1984 | Tosaki et al. | 428/195 |
| 4,569,876 | 2/1986 | Nakakita | 428/131 |
| 4,650,923 | 3/1987 | Nishigaki et al. | 174/68.5 |

Primary Examiner—Donald P. Walsh
Assistant Examiner—Chrisman D. Carroll
Attorney, Agent, or Firm—Ira David Blecker

[57] ABSTRACT

A ternary-alloy/glass composite suitable for use in vias in glass-ceramic electronic structures includes gold, palladium, and either platinum or silver in the alloy where the gold is less than 50% by weight of the alloy. The alloy is combined with glass frit where the glass is present as 5-50% by volume in the composition. The ternary-alloy glass composite is sintered in the glass-ceramic structure and provides a hermetic seal. Chips and pins can be bonded directly to the ternary-alloy/glass composite using a eutectic braze without causing cracks in the glass-ceramic. The ternary-alloy/glass composite has good adhesion with glass-ceramics and is useful in vias in electronic structures.

7 Claims, 4 Drawing Sheets

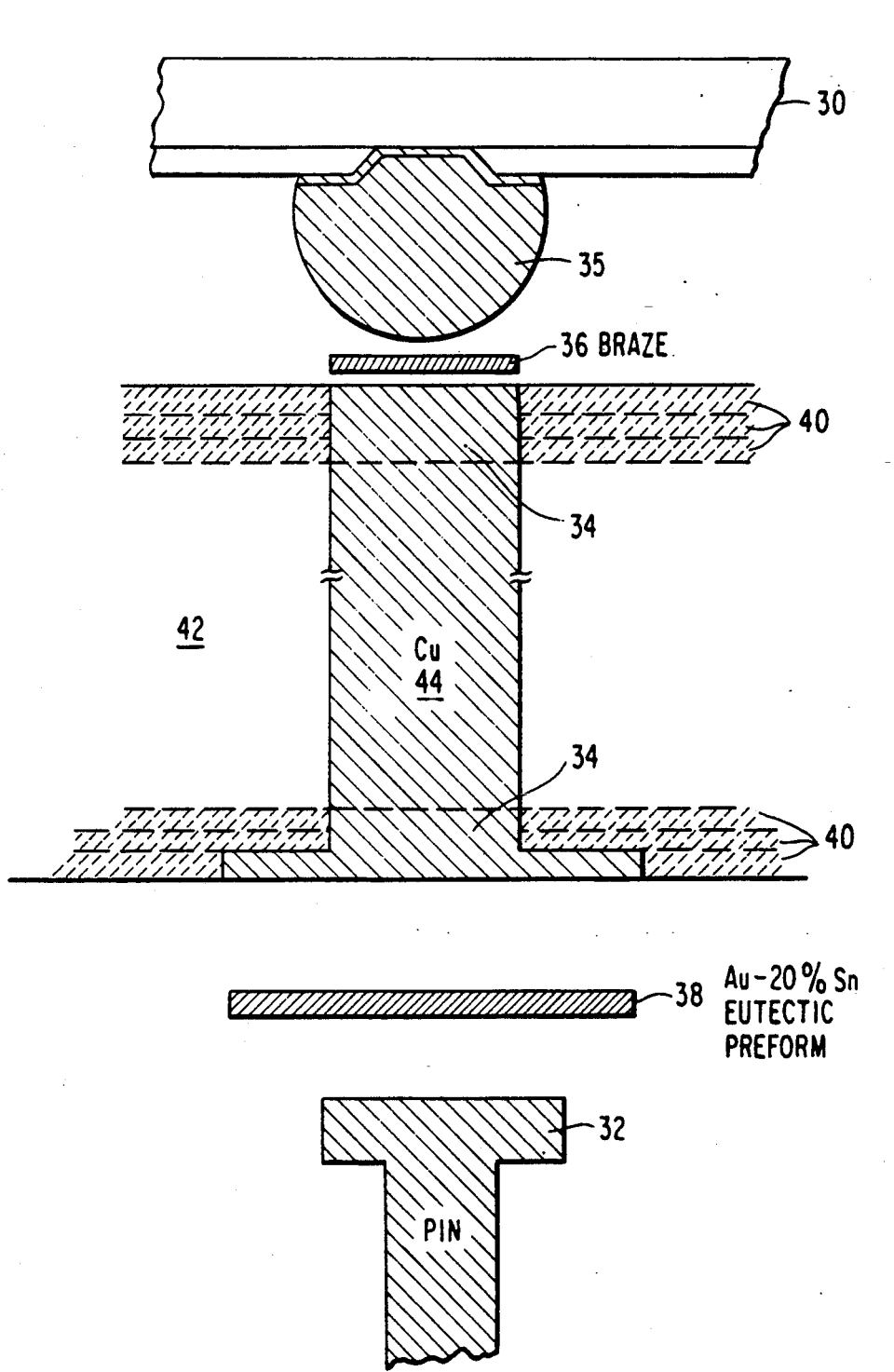

LOW-COST TERNARY COMPOSITE FOR USE IN VIAS IN GLASS-CERAMIC STRUCTURES

BACKGROUND OF THE INVENTION

1. Field of the Invention

The present invention is generally related to the metallization used in vias in glass-ceramic electronic structures and, more particularly, to a low-cost ternary composite for use in such glass-ceramic structures.

2. Description of the Prior Art

FIG. 1 shows the general design of a prior art input/output (I/O) pad for a glass-ceramic electronic structure. A capture pad 10 is evaporated on top of a glass-ceramic structure 12 over metal filled vias 14 and 16. The capture pad 10 typically comprises a multilayered structure of titanium, copper and chromium (e.g., 0.2 $\mu$m Ti/30 $\mu$m Cu/0.1 $\mu$m Cr). The metal filled vias 14 and 16 typically comprise a good metallic conductor such as copper. The copper via is capable of forming a tight bond with the capture pad 10; however, there is generally poor adhesion between the copper via and the glass-ceramic structure 12 which leads to the formation of voids and channels that need to be filled to prevent liquids and gases encountered during and after processing from entering the vias 14 and 16 and causing damage. To provide this protective seal, a polyimide cushion 22 is applied over the glass-ceramic structure 12 and capture pad 10. A small opening is then made in the polyimide cushion 22 above the vias 14 and 16, and a thin film bottom surface metallurgy (BSM) pad 24 is bonded to the capture pad 10 through the opening. The BSM pad 24 is typically a layered structure of chromium, copper, titanium and gold (e.g., 0.1 $\mu$m Cr/6.0 $\mu$m Cu/1.0 $\mu$m Ti/1.0 $\mu$m Au). A pin 26 is connected directly to the BSM pad 24 using Au/Sn eutectic braze 28. For example, a Au/Sn eutectic having 20 wt % Sn can be brazed to the BSM pad 24 at 380°-400° C. In addition to providing a protective polyimide barrier for the vias 14 and 16, the structure shown in FIG. 1 has been used instead of bonding the pin 26 directly to the capture pad 10 because direct bonding tends to transfer stress from the pin 26/braze 28/pad 10 structure to the glass-ceramic 12 and may cause cracking. Any viable solution to pin 26 bonding must minimize the transfer of stress to the glass-ceramic 12 to prevent cracking.

The prior art structure shown in FIG. 1 has several disadvantages. First, the chromium layer of the BSM pad 24 has poor adhesion to the polyimide cushion 22. Moreover, the polyimide cushion 22 tends to degrade in humid environments which may be encountered in the field and this degradation will further exacerbate the poor adhesion problem of the BSM pad 24. Because the area where the BSM pad 24 and the capture pad 10 bond together is relatively small compared to the total areas of the pads, any loss of adhesion with the polyimide cushion 22 will drastically reduce the strength of the pin 26 joint. Second, producing the pin 26 connection is very expensive and involves the evaporation of seven metal layers for the capture pad 10 and BSM pad 24 (thin film technology), and the application of a polyimide layer for the polyimide cushion 22, as well as the formation of a via in the polyimide cushion 22. Third, if a failure occurs anywhere in the film structure of the joint, the joint cannot be reworked because of the manufacturing process employed. Thin film structures cannot be easily reworked due to process complexity and cost.

Metal-glass conductors are well known in the art. Milkovich et al. U.S. Pat. No. 3,537,892 discloses metallized conductors comprised of gold, platinum, and palladium which are mixed with vitreous frit. The powdered metals and glass are sifted, mixed together, combined with a vehicle to form a paste, and the paste is printed on a substrate followed by drying and firing. Milkovich et al. anticipate using a large weight percentage of gold in the mixture which makes the conductors very expensive (e.g., 60-75% gold, 10-25% platinum, and 5-30% palladium). Moreover, Milkovich et al. is directed to producing conductive lines on a substrate, as opposed to metallized vias in a substrate. Morse U.S. Pat. No. 3,934,336 discloses the use of a sintered gold-glass conductive material in a ceramic substrate of an electronic package. As pointed out by Morse, the glass binder provides for good adhesion with the ceramic substrate. Nishigaki et al. U.S. Pat. No. 4,650,923 describes a ceramic article which utilizes a silver-palladium mixture in the vias, and Tsunashima U.S. Pat. No. 4,323,593 discloses the formation of noble (gold, silver, or platinum) metal-glass vias in printed circuit boards (PCBs).

SUMMARY OF THE INVENTION

It is therefore an object of the present invention to use a precious metal alloy/glass composite in vias in glass-ceramic electronic structures.

According to the invention, a ternary-alloy comprised of gold (Au), palladium (Pd), and a third metal which is either platinum (Pt) or silver (Ag) is combined with glass to form a composite which can be used in vias in glass-ceramic structures. The ternary-alloy/glass composite is impervious to processing liquids and, therefore, protects the vias without requiring a polyimide backfill. In addition, the noble character of the metals protects the vias from chemical attack, field corrosion, and metal migration. Chips and pins can be directly joined to the ternary-metal/glass composite without additional metallization. However, a pre-braze can be used to enhance chip joining. A glass-ceramic structure made using the ternary-alloy/glass composite remained crack-free after performing sintering, brazing, and chip/pin joining steps. The preferred alloys are 12% Au-36% Pd-52% Pt and 30% Au-30% Pd-40% Ag, and the alloys are combined with 5-50% glass. All compositions are in weight percent except for the glass which is in volume percent.

BRIEF DESCRIPTION OF THE DRAWINGS

The foregoing and other objects, aspects and advantages will be better understood from the following detailed description of the preferred embodiments of the invention with reference to the drawings, in which:

FIG. 2 is a cross-sectional side view of a via in a electronic substrate where a chip and a pin are going to be directly brazed to the top and bottom of the via;

DETAILED DESCRIPTION OF A PREFERRED EMBODIMENT OF THE INVENTION

Figure 1:
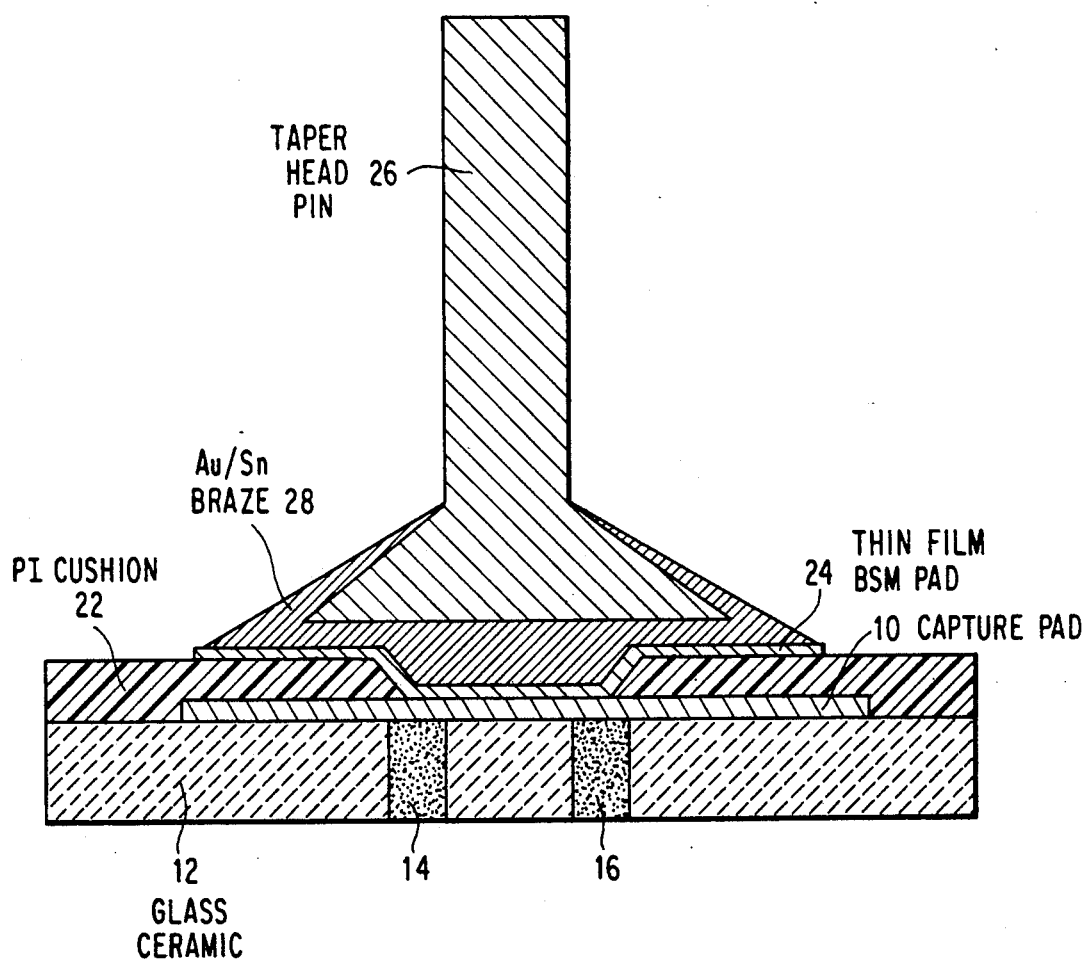
FIG. 1 is a cross-sectional side view of a pin connected to an I/O pad where a polyimide coating is provided for sealing the vias and as a cushion to reduce stress.
Figure 3A:
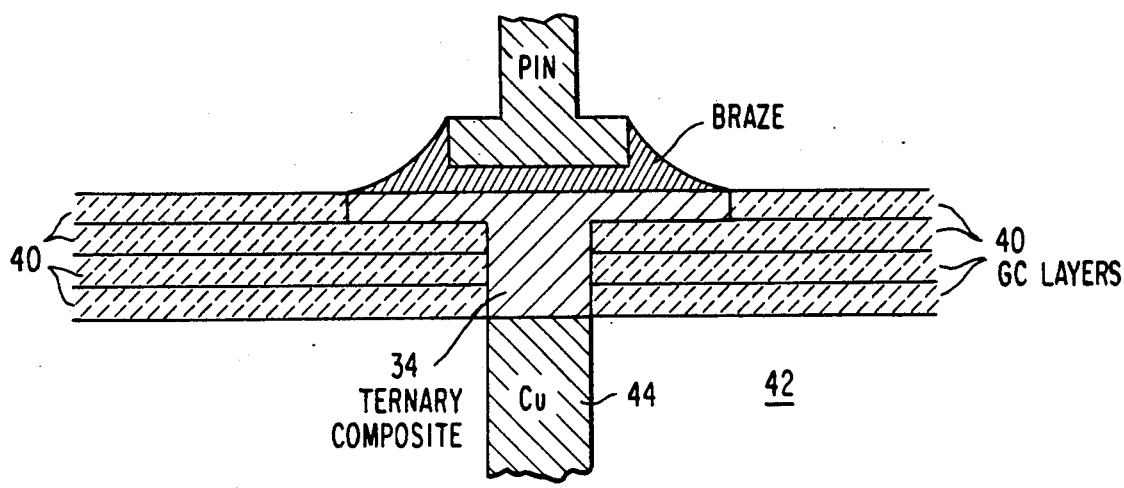
FIGS. 3a-b are cross-sectional side views of a ternary composite and braze after a pin and chip have been bonded to a via cap, respectively.
Figure 3B:
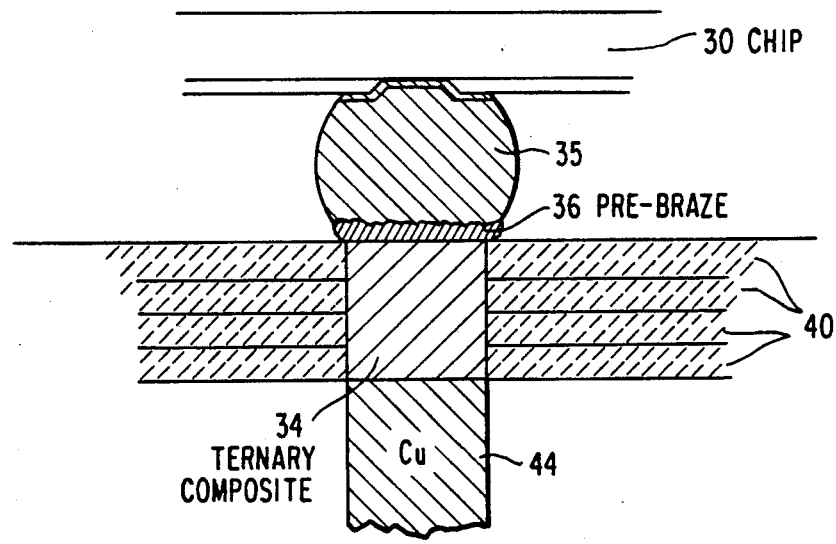

Referring now to the drawings, and more particularly to FIGS. 2, 3a, and 3b, there is shown an integrated circuit chip 30 and a pin 32 being directly joined to the ternary-alloy/glass composite 34 of the present invention using a brazing compound 36 or a gold (Au)-Tin (Sn) eutectic braze preform 38. The brazing compound 36 may also be a Au-Sn composition and the chip 30 is provided with solder balls 35 which can be Pb-Sn. The ternary-alloy/glass composite 34 is positioned within an opening in the glass-ceramic layers 40 on substrate 42 above copper via 44. The openings may be created by punching through the outer green sheet layers of the glass-ceramic laminate or by other suitable means, and the ternary-alloy/glass composite 34 can be positioned within the openings by screening on as a paste. The ternary-alloy/glass composite 34 is sintered with the glass-ceramic 12 prior to brazing on the chip 30 or pin 32. Sintering the compositions 34 of the present invention with the glass-ceramic 40 has been found to produce a hermetic seal for vias 14 and 16.

The ternary-alloy/glass composite 34 of the present invention comprises Au, Pd, and either Ag or Pt, where less than 50% by weight of the alloy is Au. Using large percentages of gold as described in Milkovich et al. U.S. Pat. No. 3,537,892 poses several problems. First, high gold concentrations raises the coefficient of thermal expansion to unacceptable levels. Second, gold reduces adhesion to the substrate. Third, gold experiences excessive reactions with solders and brazes, thus embrittling the joint due to high intermetallic formation. Glass frit (vitreous frit) is combined with the alloy as a 5-50% by volume component. In one embodiment, the ternary-alloy comprises 5-35% Au, 25-45% Pd, and 25-60% Pt, by weight. In another embodiment, the Pt is replaced by Ag, and the Au, Pd, and Ag are present in the same proportions as in the first embodiment. An alloy powder fitting these criteria can be provided by co-precipitation and may be commercially obtained from Metz Metallurgical, Inc. The alloy powder is then combined in the desired weight proportion with glass frit. The glass frit may be $MgO-Al_2O_3-nSiO_2$ which is also known as cordierite or MAS, or $Li_2O-Al_2O_3-nSiO_2$ which is also known as LAS, or any other suitable material that provides for adhesion of the composite 34 with the glass-ceramic 40. It has been found that the composites have excellent wettability, even with a glass content of 40% by volume. The thermal expansion coefficient of the ternary-alloy/glass composite 34 increases with lower glass content. For example, in a 12% Au-36% Pd-52% Pt alloy with 40% glass by volume, the thermal expansion coefficient was $6.5*10^{-6}°C.^{-1}$; however, with 25% glass by volume, the thermal expansion coefficient was $8*10^{-6}°C.^{-1}$. The thermal expansion coefficient of the ternary-alloy/glass composite 34 should be compatible with the glass-ceramic 40 to avoid thermal stress cracking.

Figure 4:
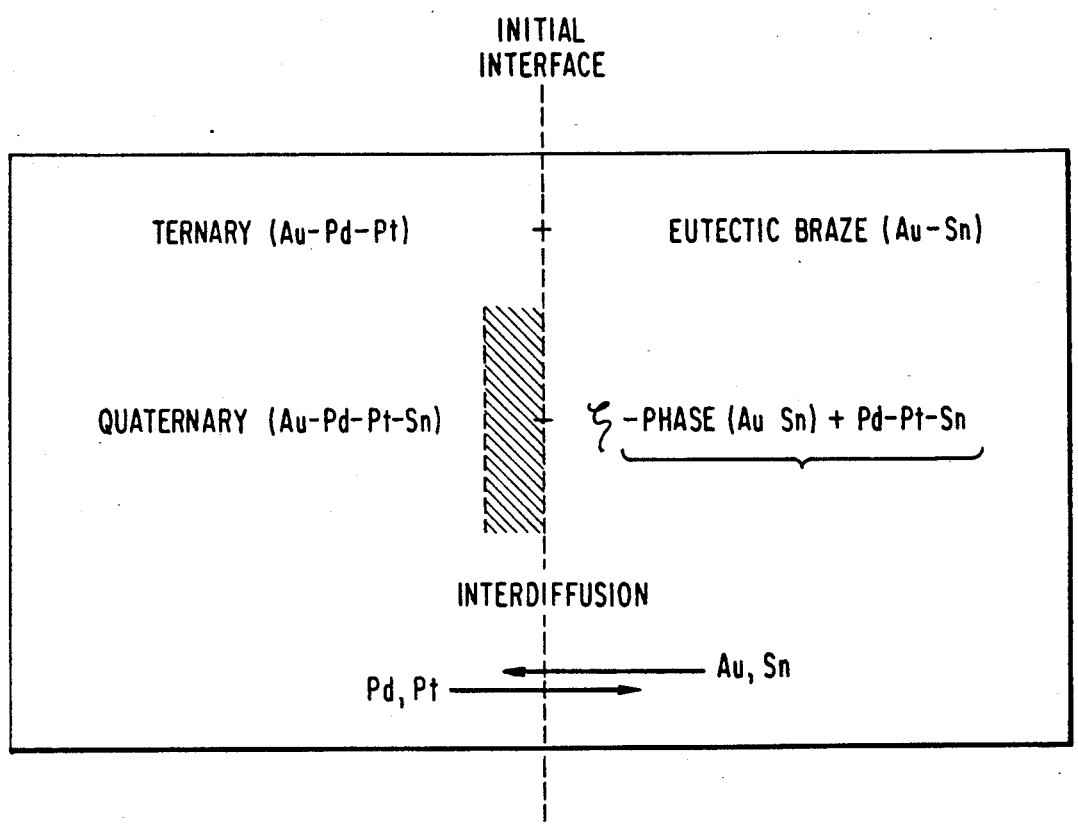
FIG. 4 is a diagram showing the interdiffusion of elements from the ternary alloy and the eutectic braze.
Figure 5:
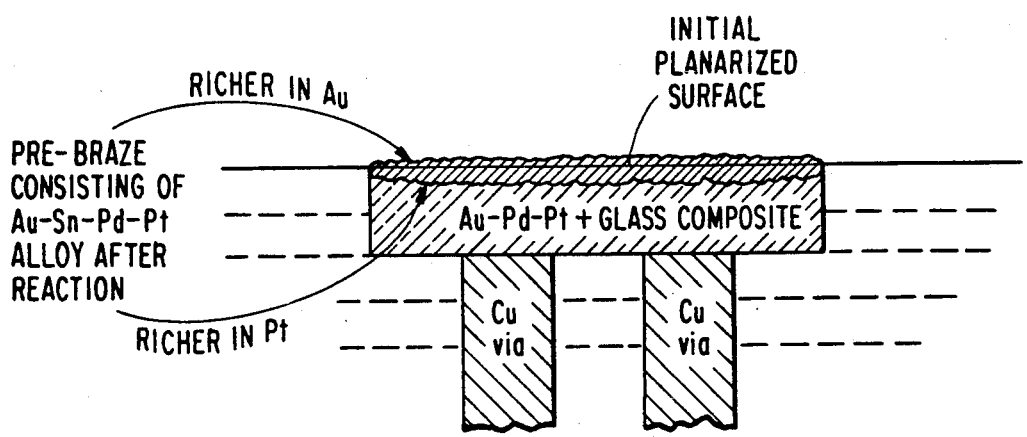
FIG. 5 is a cross-sectional side view of ternary-alloy/glass composite capped vias after brazing.

As shown in FIGS. 4 and 5, a ternary-alloy/glass composite (Au-Pd-Pt+glass) reacts with a eutectic braze comprised of 80% Au and 20% Sn to form a quaternary joint having Au, Pd, Pt, and Sn. While Sn diffuses into the ternary-alloy/glass composite from the eutectic braze, Pd and Pt diffuse into the eutectic braze from the ternary-alloy. Diffusion of Pd and Pt causes the formation of a zeta phase comprised of a secondary solid of high ductility consisting of approximately 90% Au and 10% Sn and a ternary solid consisting of Sn, Pd, and Pt which is dispersed in the braze matrix. As best shown in FIG. 5, brazing produces a quaternary joint which provides a gradual transition from the ternary-alloy/glass composite to the Au-Sn eutectic where the quaternary joint of Au-Sn-Pd-Pt is richer in Pt on the ternary-alloy/glass composite side and richer in Au on the Au-Sn eutectic side. A particular advantage of the interdiffusion of the Sn, Pd, and Pt is that the melting point of the quaternary braze joint produced is greater than 500° C. which is much higher than the 280° C. melting point of the Au-Sn eutectic. The higher melting point allows chips to be joined to the ternary-alloy/glass composite without the joint being subject to reflowing during further high temperature processing.

As discussed above, the inventive composites have approximately 25-45% Pd, by weight. Pd provides for good adhesion of the alloy with the glass frit and glass-ceramic since it diffuses in the glass and reacts with it to provide the needed bond. In the case of solder joining, sufficient available Pd must be present for its reaction with Sn, which occurs preferentially. In addition, the inventive composites include 25-60% Pt or Ag, by weight. The Pt and Ag maintain the thermal expansion coefficient within a range compatible with the glass-ceramic substrate (the thermal expansion coefficients of Pt and Ag are significantly less than Au and Pd); hence, Pt and Ag serve the function of controlling thermal stress. In addition, in reactions with Pb-Sn solders, where Pd reacts preferentially with Sn to form Pd-Sn intermetallics, sufficient Pt or Ag alloyed with the Au is needed in the remaining metallurgical structure which becomes depleted of Pd. Hence, Pt and Ag preserve the structure and strength of the joint. Finally, the Au (5-35% by weight) in the ternary alloy allows for a flexibility in melting point. The melting point of the alloy determines the sintering properties. In the Au-Pd-Pt alloys, the melting point varies from 450°-1600° C., and sinters well by standard processes from 950°-1500° C. Replacement of Pt with Ag in the ternary-alloy/glass composite produces an alloy which melts in the temperature range of 1230°-1370° C. Substitution of Ag for Pt in the ternary-alloy results in a far less expensive alloy; however, the thermal expansion coefficient tends to be higher than that for the Au-Pd-Pt alloys (e.g., approximately $10^{-5}°C.^{-1}$). Nevertheless, the ductility of the Ag limits the stresses to low values which can easily be tolerated by the glass-ceramic.

Glass-ceramic substrates have been prepared using a 12% Au-36% Pd-52% Pt, by weight, ternary alloy/10% by volume glass composite. No problems were encountered through the process of screening, laminating, sintering, lapping and polishing. No significant fluorescent die penetrant (sold under the trade name of magna flux) was detected after sintering and after subjecting the part to a braze cycle. The impermeability to the die penetrant shows that the joint will be impervious to process liquids. Therefore, the ternary-alloy/glass composite according to the invention provides a hermetic seal for the vias which negates the need for a polyimide backfill operation. The magna flux test was repeated after polishing and, again, after an additional braze cycle, and both tests yielded negative results. In addition, no cracks or via/wall separation was observed through three cycles of sintering, brazing, and chip joining. Hence, direct chip and pin bonding to the ternary-alloy/glass composite is possible since residual stresses in the joint are not great enough to cause cracking of the glass ceramic. Pre-brazing the ternary-alloy/glass composite enhances chip joining.

One substrate was subjected to actual chip joining of twenty chips with two additional reflows at 350° C. Again, no magna flux penetration occurred and no cracking was observed anywhere in the via and surrounding glass-ceramic. On another substrate, hundreds of pins were joined. Wetting was excellent and the strength of the joint was commensurate with the strength of the braze for the cross-sectional area. Similar hermeticity and non-cracking results are expected for blends that use Ag instead of Pt because the functions served by the two elements in the alloy are the same. An additional feature of the present invention is the fact that the noble metals used in the alloy help protect against chemical attack, field corrosion, and metal migration.

While the invention has been described in terms of its preferred embodiment where a ternary-alloy comprised of gold, palladium, and a third metal of either silver or platinum is combined with glass frit, installed in a glass-ceramic substrate, and sintered to provide a hermetic seal for underlying vias and which can have pins and chips connected thereto by direct bonding (brazing), those skilled in the art will recognize that the invention can be practiced with considerable variation within the spirit and scope of the appended claims.

Having thus described our invention, what we claim and desire to secure by Letters Patent is as follows:

1. A precious metal alloy/glass composite for use in vias in glass-ceramic electronic structures, comprising:
   an alloy including gold, palladium, and a metal selected from the group consisting of platinum and silver, where the gold ranges between 5 and 50% by weight of said alloy; and
   a glass, said glass being mixed with said alloy to form a precious metal alloy/glass composite, said glass ranges between 5 and 50% by volume of said precious metal alloy/glass composite.

2. A precious metal alloy/glass composite as recited in claim 1 wherein said alloy comprises 5-35% by weight of gold, 25-45% by weight of palladium, and 25-60% by weight of platinum.

3. A precious metal alloy/glass composite as recited in claim 2 wherein said alloy is comprised of 12% by weight of gold, 36% by weight of palladium, and 52% by weight of platinum.

4. A precious metal alloy/glass composite as recited in claim 2 wherein said glass comprises approximately 10% by volume of said precious metal alloy/glass composite.

5. A precious metal alloy/glass composite as recited in claim 1 wherein said alloy comprises 5-35% by weight of gold, 25-45% by weight of palladium, and 25-60% by weight of silver.

6. A precious metal alloy/glass composite as recited in claim 5 wherein said alloy comprises 30% by weight of gold, 30% by weight of palladium, and 40% by weight of silver.

7. A glass-ceramic electronic structure having a via formed therein, positioned within said via is a precious metal alloy/glass composite comprised of an alloy including gold, palladium, and a metal selected from the group consisting of platinum and silver, where the gold ranges between 5 and 50% by weight of said alloy; and a glass, said glass being mixed with said alloy to form a precious metal alloy/glass composite, said glass ranges between 5 and 50% by volume of said precious metal alloy/glass composite.

* * * * *